US007791210B2

(12) United States Patent
Miller et al.

(10) Patent No.: US 7,791,210 B2
(45) Date of Patent: Sep. 7, 2010

(54) SEMICONDUCTOR PACKAGE HAVING DISCRETE NON-ACTIVE ELECTRICAL COMPONENTS INCORPORATED INTO THE PACKAGE

(75) Inventors: Leah Miller, Fremont, CA (US); Aritharan Thurairajaratnam, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 359 days.

(21) Appl. No.: 10/702,996

(22) Filed: Nov. 5, 2003

(65) Prior Publication Data
US 2005/0093173 A1 May 5, 2005

(51) Int. Cl.
*H01L 23/48* (2006.01)

(52) U.S. Cl. .................. 257/780; 257/691; 257/724; 257/690; 257/734; 257/776; 257/E23.07

(58) Field of Classification Search .............. 257/698, 257/780, 691, 724, 690, 734, 776, E23.07
See application file for complete search history.

(56) References Cited

U.S. PATENT DOCUMENTS

| 6,483,714 | B1 * | 11/2002 | Kabumoto et al. ........ 361/760 |
| 6,806,569 | B2 * | 10/2004 | Breisch et al. ............ 257/728 |
| 6,907,658 | B2 * | 6/2005 | Li ........................... 29/832 |
| 2002/0064029 | A1 * | 5/2002 | Pohjonen .................. 361/719 |
| 2004/0012938 | A1 * | 1/2004 | Sylvester et al. ........... 361/794 |

OTHER PUBLICATIONS

A.H. Feingold et al., "Compliant Dielectric and Magnetic Materials for Buried Components", http://www.electroscience.com/publications/IMAPS2002(2).pdf, 6 pages.

* cited by examiner

*Primary Examiner*—Lynne A Gurley
*Assistant Examiner*—Junghwa M Im
(74) *Attorney, Agent, or Firm*—Beyer Law Group LLP

(57) ABSTRACT

Embodiments of the invention include a semiconductor integrated circuit package that includes a substrate having an integrated circuit die attached thereto. The substrate further includes at least one signal layer having a plurality of electrical signal traces formed thereon. The package includes a discrete non-active electrical component mounted on the package so that the integrated circuit die is electrically connected with an electrical signal trace of the package through the discrete non-active electrical component. And in one particular implementation, the discrete non-active electrical component comprises a capacitive element arranged in series between the electrical signal traces and the die so that the capacitor operates as a package mounted AC coupling capacitor.

16 Claims, 6 Drawing Sheets

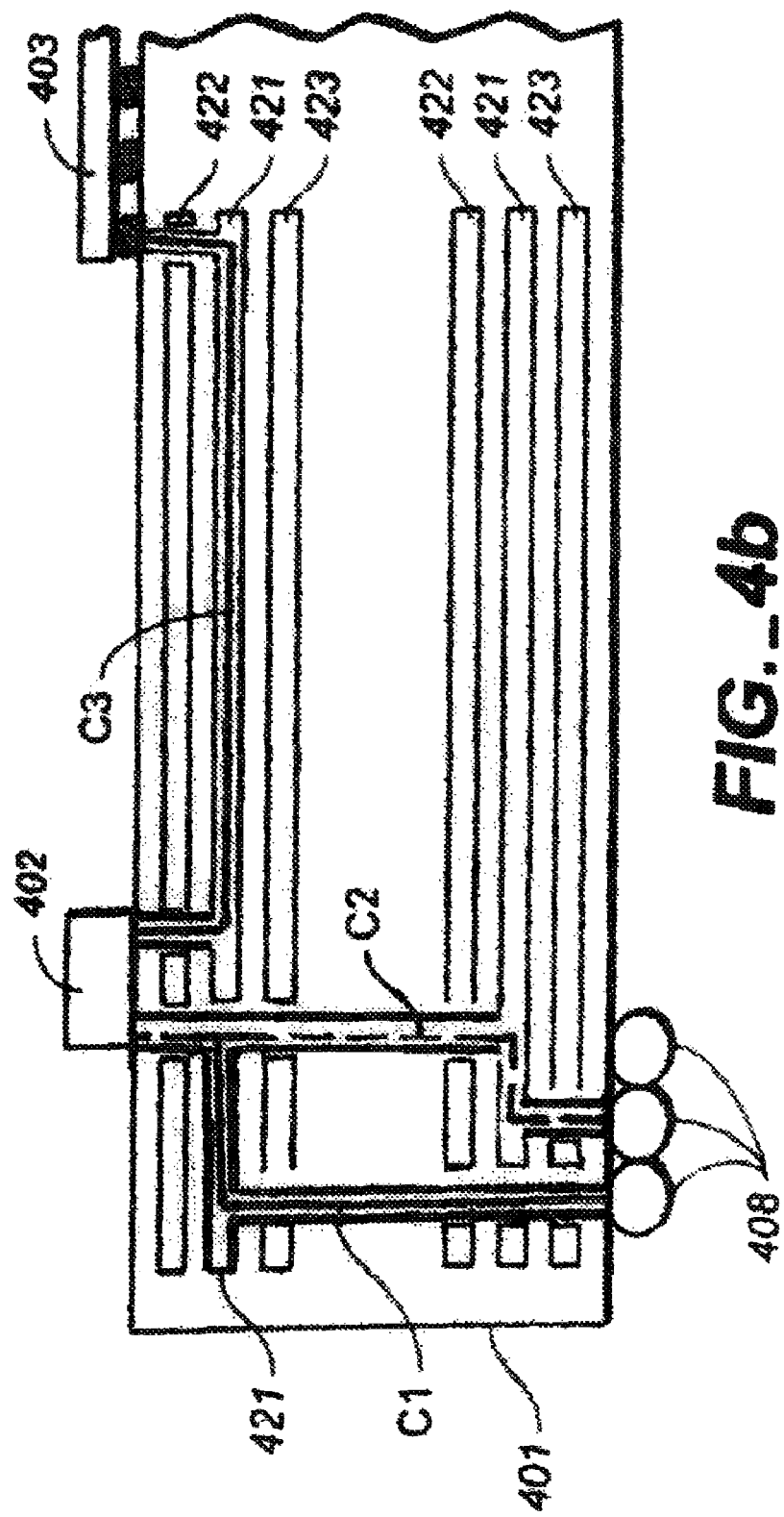
FIG._4b

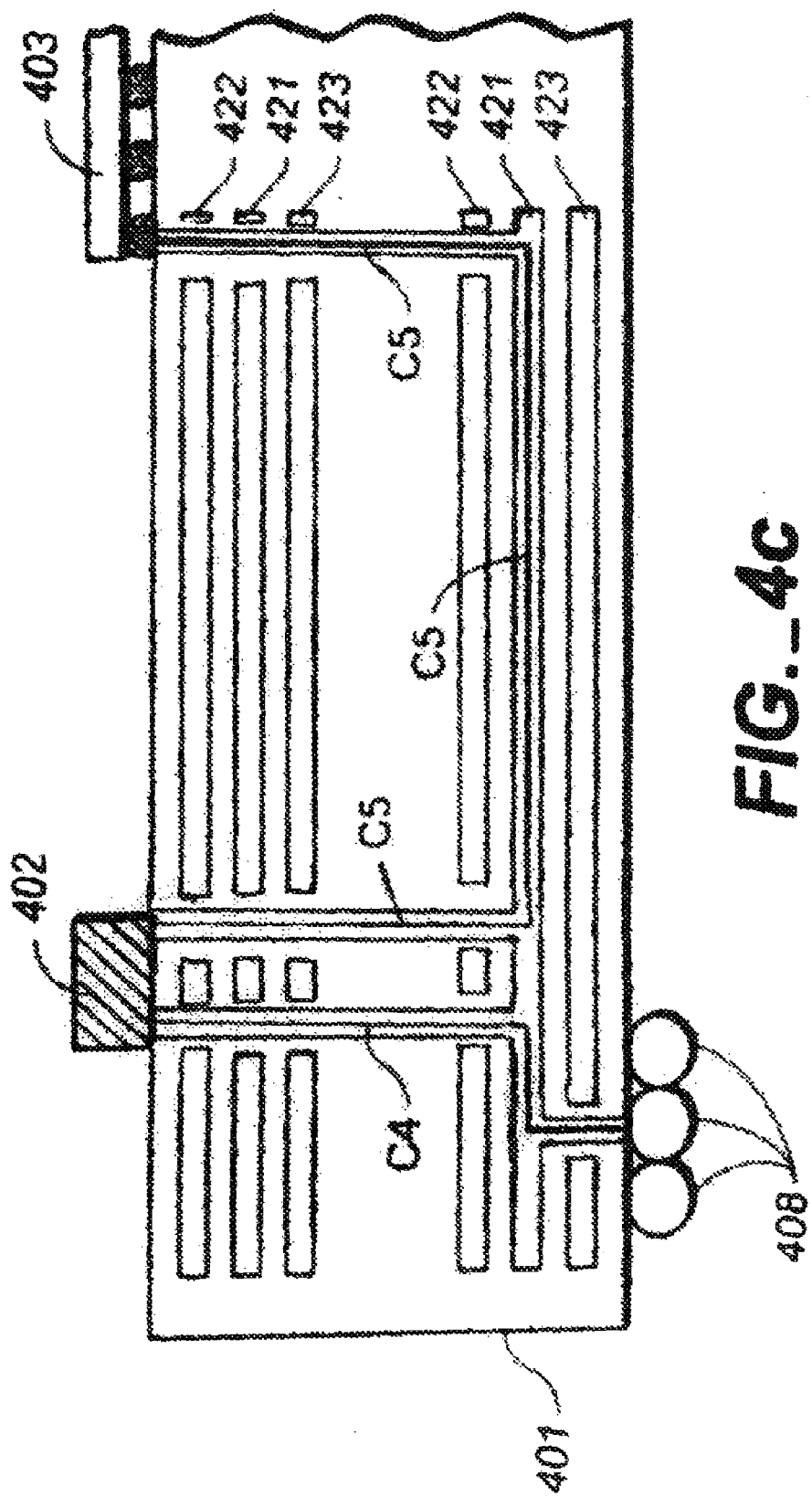
FIG._4c

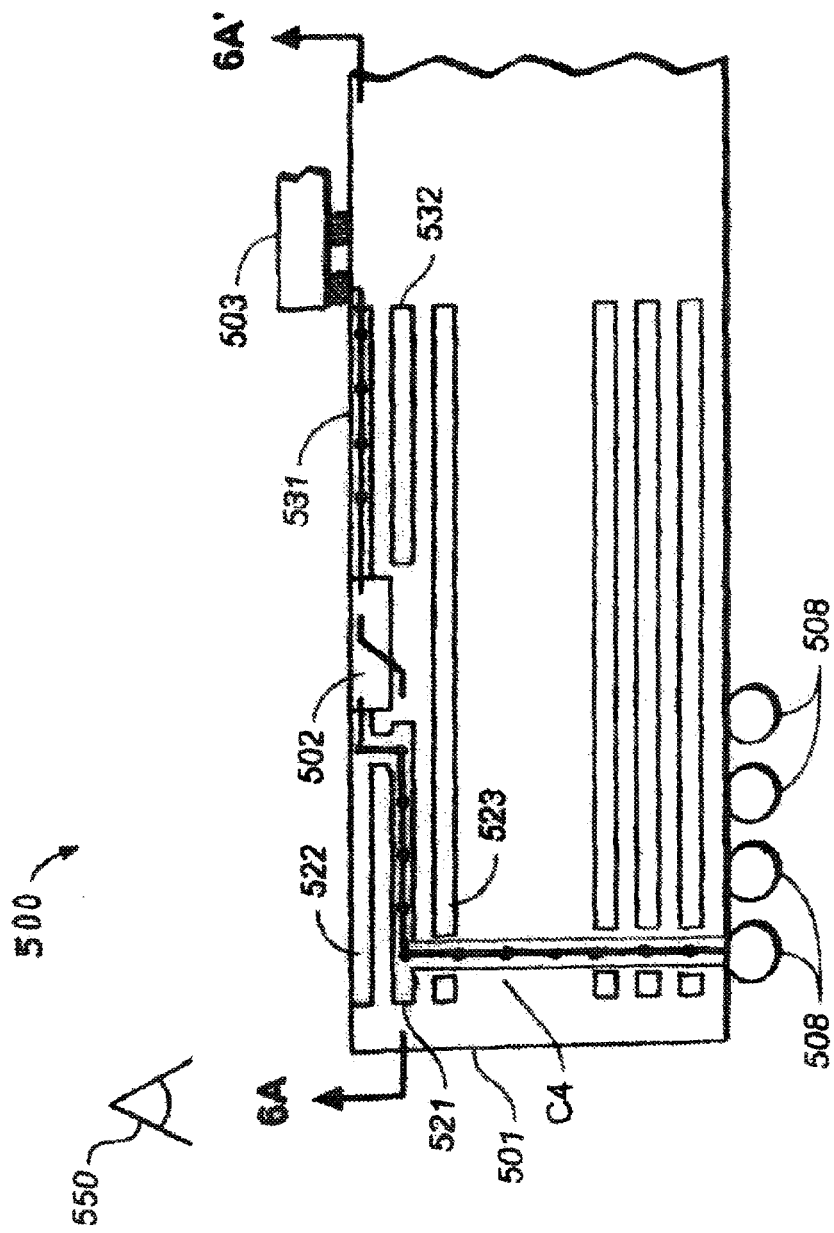
FIG._5

SEMICONDUCTOR PACKAGE HAVING DISCRETE NON-ACTIVE ELECTRICAL COMPONENTS INCORPORATED INTO THE PACKAGE

TECHNICAL FIELD

The invention described herein relates generally to semiconductor device packaging. In particular, the invention relates to semiconductor device packages that are constructed such that discrete non-active electrical components are incorporated directly onto the semiconductor package. Moreover, these discrete non-active electrical components are electrically interfaced between the integrated circuit die and the electrical traces of the electrical signal routing layers of the package.

BACKGROUND

Integrated circuit device packages are used in many different implementations. Such packages encapsulate and protect integrated circuits as well as provide a multiplicity of electrical connections for the encapsulated integrated circuit. In one of many common uses, such packages are mounted printed circuit boards (PCB's) where the packages can be electrically interconnected with other electrical components. In some implementations, circuit structures are designed so that an AC (alternating current) coupled interconnection is required between two components operating at different DC (direct current) levels. Capacitors are sometimes used to maintain the AC portion of the signal for components operating at different DC levels. Capacitors connected in series between the two components can be used to filter out DC offset between the components. Commonly, such capacitors are mounted on the PCB where they are coupled in series with the interconnect structures to filter the DC offset between chip mounted components and non-chip mounted components, or filter the DC offset in chip-to-chip communication.

One such PCB configuration 100 is shown in the simplified schematic illustration of FIG. 1. An integrated circuit device package 101 (shown here as a ball grid array type package) is mounted to a PCB 120 using a plurality of solder balls 102. In FIG. 1, the package 101 includes an encapsulated integrated circuit device (also referred to herein as an IC die or chip) mounted to a substrate. The package 101 is commonly attached to the PCB 120 with solder balls 102 using reflow techniques. In the depicted embodiment, a first component 130 operating at one DC voltage is electrically connected to another component (incorporated in the package 101) operating at another DC voltage. Capacitor 110 is mounted on the PCB 120. The capacitor 110 is connected in series between the first component 130 and the package 101. In such configuration the capacitor 110 operates as an AC filter between the first component 130 and selected components of the package 101. The PCB mounted capacitor 110 is connected with solder pads on the PCB using electrical connectors 104. Similarly, the capacitor 110 is connected to the first component 130 (which can be mounted elsewhere on the PCB) using electrical connectors 105.

Although such conventional implementations are useful for many applications, they place certain limitations on PCB design. For example, for each PCB designed for use with a given IC chip, appropriate capacitors must be incorporated into the design of the PCB in order to accommodate the IC chip. This consumes valuable space on the PCB and can lead to serious routing constraints on the PCB. Thus, there is a need for IC chips that do not require valuable space on the PCB board to be consumed by such filtering capacitors.

SUMMARY OF THE INVENTION

In accordance with the principles of the present invention, an improved semiconductor package and methods for its fabrication are disclosed.

In general, the present invention is directed toward a novel approach for incorporating discrete non-active electrical components into an IC package. In some particularly advantageous implementations of the invention, a package of the invention incorporates a series mounted capacitor between the signal traces of the package substrate and the integrated circuit die.

One embodiment of the invention includes a semiconductor integrated circuit (IC) package having a substrate with an integrated circuit mounted thereon. The substrate includes at least one signal layer having a plurality of electrical signal traces and a discrete non-active electrical component mounted on the package. The discrete non-active electrical component is mounted on the package so that the integrated circuit die is electrically connected with an electrical signal trace of the package through the discrete non-active electrical component. And in one particular implementation, the discrete non-active electrical component comprises a capacitive element that operates as an AC coupling capacitor.

In another embodiment the invention comprises a semiconductor integrated circuit (IC) package having a substrate including at least one electrical ground plane, at least one electrical power plane, at least one electrical signal layer having a plurality of signal traces, and having a plurality solder balls formed on a surface thereof. An integrated circuit die is mounted to the substrate such that the die is electrically connected with some of the solder balls using signal traces. And a discrete non-active electrical component is electrically connected to the integrated circuit die and to a signal trace.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which:

FIGS. 4(a), 4(b), and 4(c) are simplified cross-section views of a semiconductor package embodiment constructed in accordance with the principles of the invention.

FIG. 5 is simplified cross-sectional view a semiconductor package embodiment incorporated an embedded capacitor to achieve AC coupling in accordance with the principles of the invention.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, semiconductor device package embodiments will be disclosed. In particular, the depicted structures depict package embodiments having discrete non-active electrical components attached to the signal traces of a signal routing layer of the package. In some embodiments, the discrete non-active electrical components comprise capacitive elements configured in a manner suitable for facilitating AC filtering between two components operating a different DC voltage levels. Such packages save space on the associated PCB's.

Figure 1:
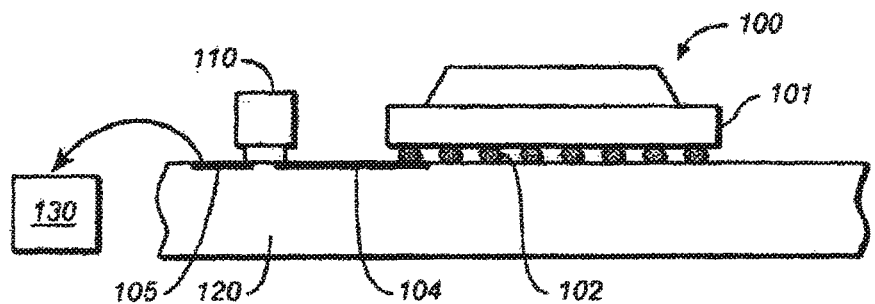
FIG. 1 is a simplified schematic cross section view of a portion of a conventional integrated circuit package mounted on a PCB board having an AC coupling capacitor.
Figure 2:
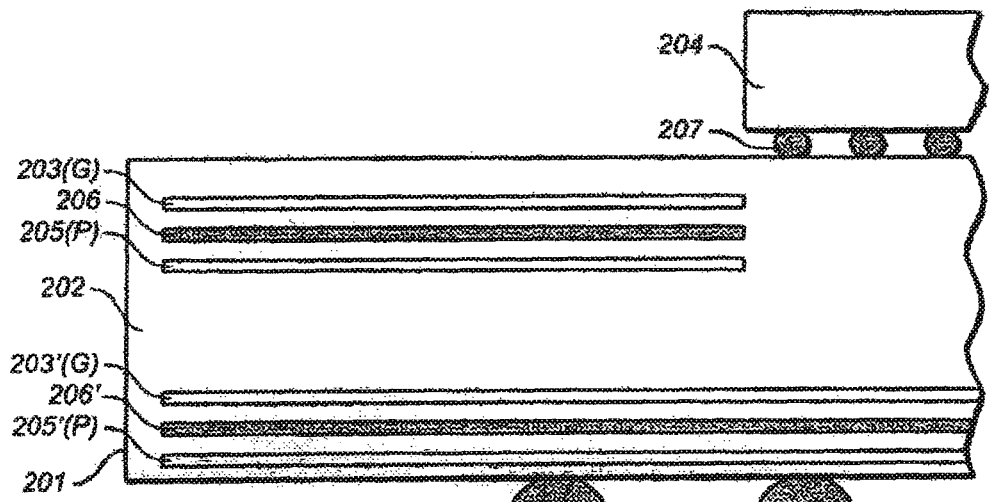
FIG. 2 is simplified cross-sectional view of a semiconductor package embodiment.

FIG. 2 depicts one embodiment of a semiconductor package 200 useful for illustrating aspects of the invention. The depicted package is a simplified cross-section view of an IC package. The substrate 201 is shown with an integrated circuit die 204 mounted thereon. The depicted substrate 201 comprises a standard multi-layer PBGA (plastic ball grid array) substrate. Typically, such substrates 201 include a core portion 202 that provides dielectric insulation for the metallization layers which form conducting planes 203, 203', 205, 205' and also for the conductive pattern of signal traces 206, 206'. Most commonly, the core 202 is formed of fiber material suspended in a cured BT (bismaleimide triazine) resin material. As is known to persons having ordinary skill in the art, many other materials are suitable as core materials. In accordance with processes well known to those having ordinary skill in the art, the core 202 is then processed to form metallization layers 203, 206, 203', 205, 206', and 205'. The conducting planes 203, 203', 205, 205' are commonly formed of copper materials or coated copper materials. Other conductive materials are also used. In the depicted illustration, the conducting planes 203 and 203' define ground planes (G). Also, conducting planes 205 and 205' define "power" planes (P) that provide a uniform power to the systems of die 204. Also, the depicted substrate 201 includes a pair of signal routing layers. The signal routing layers each comprise a patterned metallization layer. In the depicted illustration the patterned metallization layers are configured to form a pattern of signal traces 206, 206'. Commonly, such patterns of signal traces 206, 206' are photolithographically patterned to create resultant pattern of signal traces 206, 206'. The signal traces 206, 206' forming the signal routing layers carry electrical signals to and from the die 204. Such signals are non-power; non-ground, electronic signals that include, but are not limited to, input/output (I/O) signals (for example, such as those signals carried to and from the package by solder balls that connect the package to an associated PCB). Such substrates 201 are commonly very thin, on the order of about 0.50-1.5 mm thick. Additionally, solder balls 210 are attached to a backside surface of the substrate 201 to facilitate the physical and electrical connection of the package 200 to a system board (e.g., a motherboard). The methods of constructing such substrates 201 are very well known to those having ordinary skill in the art.

The depicted configuration is referred to as a "stripline" routing configuration. In such configurations, the signal traces 206, 206' are formed between the ground planes and power planes. This is advantageous because the ground planes (203, 205) and power planes (203', 205') provide electromagnetic shielding to the signal traces 206, 206' sandwiched in between. A related structure called a "microstrip" is configured so that the ground and power planes are on one side of the signal traces. Consequently, in such a "microstrip" configuration, the signal traces are only shielded on one side. Commonly, the integrated circuit (IC) die 204 is flipped over and attached to a front side surface of the substrate 201. Commonly, such attachment is accomplished using solder balls 207 which are reflowed to mechanically bond the die 204 to the substrate 201. Also, the reflowed solder balls 207 establish electrical connections with electrical connections on the substrate (which can also connect to underlying layers using conducting vias that penetrate through the substrate 201) or with underlying solder balls 207. The die 204 is encapsulated using an underfill material (not shown) that protects and seals the inner components of the package 200. Such underfill materials are commercially available and well known in the art.

Aspects of the invention contemplate moving discrete non-active electrical components, which have heretofore been located on the PCB board, directly on to the IC package. In such implementations the discrete non-active electrical components can be moved closer to the die, thereby, in many cases, enhancing the effectiveness of the discrete non-active electrical components. Moreover, by moving discrete non-active electrical components onto the package valuable space can be saved on the PCB.

In general, the present invention is directed toward a novel approach for incorporating discrete non-active electrical components into an IC package. Such discrete non-active electrical components can include, but are not limited to, capacitors, resistors, inductors, and other similar non-active electrical components One particular embodiment incorporates an AC filtering capacitor directly into the IC package, thereby obviating the need for such capacitors on the PCB.

Figure 3:
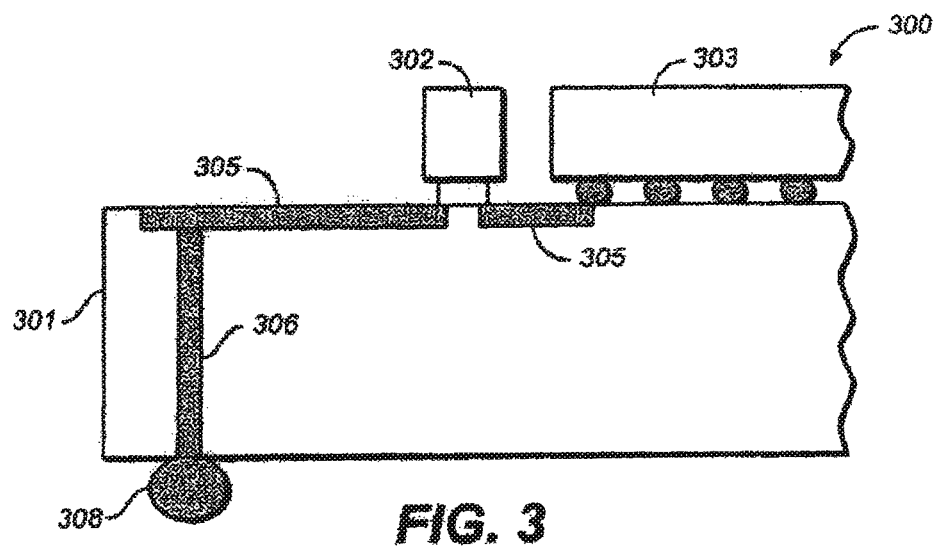
FIG. 3 is simplified cross-sectional view of a semiconductor package embodiment having a discrete non-active electrical component formed thereon in accordance with the principles of the invention.

FIG. 3 is a very simplified depiction of a generalized application of the principles of the present invention. In the depicted implementation, a package 300 includes a substrate 301 having a semiconductor integrated circuit 303 mounted on a surface thereof. Additionally, a non-active electrical component (in this case a capacitor 302) is mounted to the substrate 301. The capacitor 302 is electrically connected with the die 303 and also connected with signal traces 305 formed on a signal routing layer. In such a configuration, the capacitor 302 operates as an AC filtering device that couples the die 303 to the signal lines 305. In the depicted implementation, the signal line 305 is electrically connected to a backside solder ball 308 by a conductive via 306. In such an implementation, I/O signal can be transmitted from an off-chip system to the solder ball 308 and into the die 303 taking advantage of AC filtering provided by the capacitor 302. The inventors also contemplate implementations wherein a signal is routed from the die 303 onto the signal traces 305 where it is filtered by the capacitor 302 and routed back onto the die 303 through other signal traces 305. The inventors further contemplate other implementations wherein signals routed to the die 303 using the signal traces 305 are filtered by the package mounted capacitor 302 but are not I/O signals.

Figure 4A:
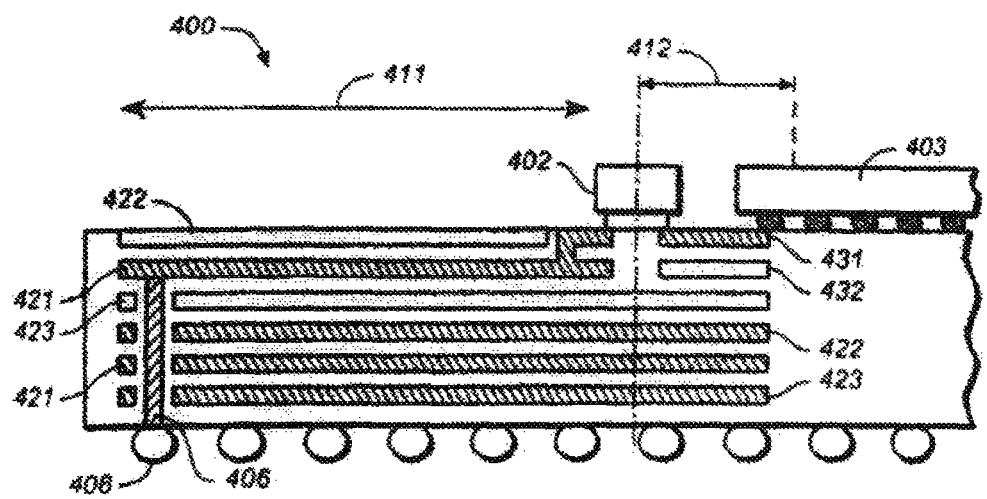

FIG. 4(a) is a simplified cross-sectional depiction of a semiconductor integrated circuit package embodiment constructed in accordance with the principles of the invention. Although the depicted package 400 includes a multi-layer package substrate 401, the principles of the invention can be applied to a single layer package as well as other multi-layer package implementations. The depicted configuration is very useful for implementations that benefit from a short conduction path between a capacitor 402 and a semiconductor integrated circuit die 403 and also benefit from a shielded signal layer. In the depicted implementation the capacitor 402 can be relatively close to the die 403 and the signal trace can be substantially shielded by the ground and power planes.

In the depicted embodiment, the substrate includes a "stripline" routing region 411 and a "microstrip" routing region 412. In the "stripline" routing region 411, signal traces 421 formed on a signal routing layer are electromagnetically shielded by the presence of overlying and underlying ground and power planes (e.g., 422, 423). In the "microstrip" routing region 412, the signal traces 431 run on the surface (e.g., above the depicted power and ground planes (423, 432)). In such an embodiment the surface trace 431 between the die 403 and capacitor 402 can be very short. A longer signal trace 421 lies between a ground plane 422 and a power plane 423 which provide shielding to the longer signal trace 421. The longer signal trace 421 connects the capacitor 402 with an underlying solder ball 408. Such solder balls 408 can be used to form I/O interconnections to off-chip components. The inventors point out that the vias can be positioned to route the electrical connections to the solder balls in many other configurations. Additionally, the signal traces of more than one layer of the substrate can be used to connect the die solder balls to the capacitors and then to the die. Practitioners having ordinary skill in the art, using the teachings provided herein, may readily envision a wide range of other implementations.

Another embodiment is described with respect to FIG. 4(b). FIG. 4(b) is a simplified cross-sectional depiction of another implementation of semiconductor integrated circuit package constructed in accordance with the principles of the invention. The embodiment 400 depicted is also a multi-layer package substrate 401. The depicted configuration is very useful for implementations that may require the non-active electrical component (in this case a capacitor 402) to be further from the die 403. This is common, where the signal trace density is high and space is a significant issue close to the die 403. Such an implementation also provides a high degree of electromagnetic shielding for the signal traces.

The depicted embodiment does not require a "microstrip" portion as depicted by FIG. 4(a). The depicted embodiment includes two layers configured in "stripline" arrangement. The signal traces 421 formed on a signal routing layer are electromagnetically shielded due to being sandwiched between a ground plane 422 and a power plane 423. In such an embodiment the signal traces 421 between the die 403 and capacitor 402 can be very long. FIG. 4(b) schematically depicts some of the conduction paths to the solder balls 408. A first conduction path C1 passes from the capacitor 402 to signal trace 421 (through an opening in a top ground plane 422) which routes the signal outward from the capacitor 402 along signal trace 421. The first conduction path C1 then passes downward through openings in a top power plane 423, through openings in another ground plane 422, and through openings in a layer corresponding to a second set of signal traces 421, and through openings in another power plane 423 until it reaches a solder ball 408. In another approach, a second conduction path C2 (indicated by the dashed lines) passes downward through the substrate 401 until it reaches a designated solder ball 408. Alternatively, the second conduction path C2 can be routed along a bottom signal trace 421 and then connected with a solder ball 408. Thus, the die 403 is connected to the capacitor 402 using a shielded signal trace 421 (path C3) and the capacitor 402 is connected with an underlying solder balls 408 using one of many possible conductive paths (e.g., C1, C2) that run along the signal traces 421. As before, such solder balls 408 can be used to form I/O interconnections to off-chip components.

Another embodiment is described with respect to FIG. 4(c). FIG. 4(c) is a simplified cross-sectional depiction of another implementation of semiconductor integrated circuit package constructed in accordance with the principles of the invention. The embodiment 400 depicted is also a multi-layer package substrate 401. The depicted configuration is also useful for implementations that may require the non-active electrical component (in this case a capacitor 402) to be further from the die 403. Certain implementations provide a high degree of electromagnetic shielding for the signal traces. The depicted embodiment includes two layers configured in "stripline" arrangement. The signal traces 421 formed on a signal routing layer are electromagnetically shielded due to being sandwiched between a ground plane 422 and a power plane 423. In such an embodiment the signal traces 421 between the die 403 and capacitor 402 can be very long. FIG. 4(c) schematically depicts another advantageous conduction path to the solder balls 408. One conduction path C4 (indicated by the dark line C4) passes from the capacitor 402 to a bottom signal trace 421 (through an opening in a top ground plane 422, an opening in top power plane 423, through an opening in the top signal layer 421, and through an opening in the bottom ground plane 422). This path C4 is then connected with a trace in the bottom signal layer 421 that routes the signal outward from the capacitor 402 along the bottom signal trace 421. The conduction path C4 then passes downward through an openings the bottom power plane 423 where it is electrically connected with a solder ball 408. The capacitor 402 can be connected to the die 403 using conductive path C5. Conduction path C5 (indicated by the dark line C5) passes from the capacitor 402 to a bottom signal trace 421 (through an opening in a top ground plane 422, an opening in top power plane 423, through an opening in the layer that corresponds to the top signal layer 421, and through an opening in the bottom ground plane 422). This path C5 is then connected with a trace in the bottom signal layer 421 that routes the signal inward toward the die 403 along the bottom signal trace 421. The conduction path C5 then passes upward (through an opening in the bottom ground plane 422, through an opening in top power plane 423, through an opening in the layer that corresponds to the top signal plane 421, through an opening in the top ground plane 422) where it is electrically connected to die 403.

In yet another advantageous implementation, embodiments of the invention can take advantage of other types of capacitive elements. In one example, such capacitive elements include embedded or buried capacitors and can include other regions of high dielectric value. Moreover, the embodiments of the invention can also include discrete non-active electrical components such as embedded resistors and embedded inductors. One such implementation incorporating an embedded capacitor is depicted, in simplified form, in FIG. 5.

FIG. 5 depicts a simplified cross-section view of a package embodiment constructed in accordance with the principles of the invention. The depicted package embodiment includes a substrate 501 upon which an integrated circuit die 503 is mounted. In the depicted embodiment, the substrate 501 comprises a standard multi-layer PBGA (plastic ball grid array) substrate. As before, such substrates 501 typically include a core between metallization layers and signal traces of signal routing layer. Again, a common core material is BT, although many other materials are known and used by those having ordinary skill in the art. Such core materials commonly have a dielectric constant of about 4.

Although the depicted package 500 is depicted as having a multi-layer package substrate 501, the principles of the invention can be applied to a single layer packages as well as other multi-layer packages. The depicted configuration implements a capacitive element (here comprising an embedded capacitor 502) and a semiconductor integrated circuit die 503 and also benefits from a shielded signal layer. In the depicted implementation the embedded capacitor 502 can be relatively close to the die 503 and the signal trace can be substantially shielded by the ground and power planes. The methods and materials of forming such embedded capacitors are known to persons having ordinary skill in the art. Particularly suitable materials for constructing such embedded capacitors have dielectric constants of greater than about 20. Barium titanate is known to be a useful material for such embedded capacitors. However, the capacitance of such embedded capacitors is determined not only by the material of the embedded capacitor, but is also dependent on the dielectric constant of the core material encapsulating the embedded capacitor. Thus, the precise materials are often a function of design tradeoffs. As is known to persons having ordinary skill in the art, other examples of particularly useful materials are discussed in many papers on the subject. A paper entitled: "Compliant Dielectric and Magnetic Materials for Buried Components" by A. H. Feingold, et al. (See: http://www.electroscience.com/publications/IMAPS2002(2).pdf) discusses several suitable materials.

In the depicted embodiment, the substrate can include a "stripline" routing region and a "microstrip" routing region. In the "stripline" routing region, signal traces 521 formed on a signal routing layer are electromagnetically shielded by ground and power planes (e.g., 522, 523). In the "microstrip" routing region a signal trace 531 runs on the surface and an underlying ground plane 532 lies under the trace 531. In such an embodiment the surface trace 531 between the die 503 and embedded capacitor 502 can be very short. The signal trace 521 connects the embedded capacitor 502 with an underlying solder ball 508. Such solder balls 508 can be used to form I/O interconnections to off-chip components. The inventors point out that the vias can be positioned to route the electrical connections to the solder balls in many other configurations. Additionally, the signal traces of more than one layer of the substrate can be used to connect the die solder balls to the capacitors and then to the die. One electrical interconnection path between the die 503 and the I/O solder balls 508 is depicted by the dotted line C4. The path C4 connects the die 503 with the embedded capacitor 502 through the signal trace 531. The capacitor 502 is connected to the ball 508 by passing through openings in the substrate and metallization layers until it is electrically connected with the signal trace 521 wherein the signal passes along the trace 521 and then through further openings in the substrate and metallization layers until it is electrically connected with the solder ball 508.

Figure 6:
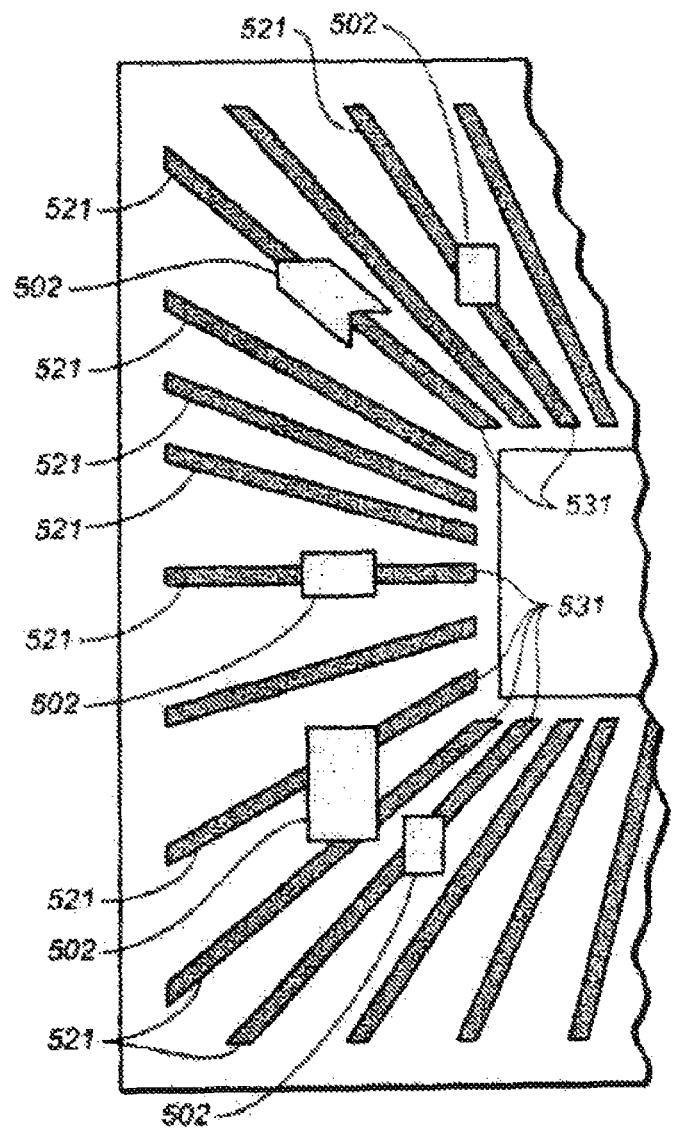
FIG. 6 is plan view of the semiconductor package depicted in FIG. 5.

FIG. 6 illustrates a portion of the package depicted as a plan view of the section 6A-6A' as viewed from the point of view of eye 550. This view reveals the signal traces 521, 531 and the embedded capacitors 502. This view is a simplified representation of one possible implementation constructed in accordance with the principles of the invention. The inventors contemplate that many other configurations may be constructed in accordance with the principles of the invention.

Figure 7:
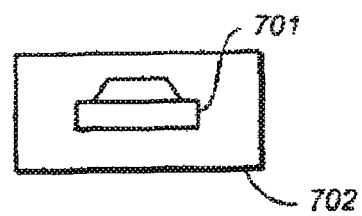
FIG. 7 is simplified block illustration of an electronic device incorporating a package embodiment constructed in accordance with the principles of the invention.

FIG. 7 is a block diagram that schematically describes some particularly attractive implementations of the invention. A IC package 701 constructed in accordance with the principles of the invention as described herein above is incorporated into a electronic device 702. The previously described embodiments can be used with any type of semiconductor packaging. The principles of the invention are particularly useful when used with IC packages 701 including, but not limited to, ball grid array (BGA) type packages and chip scale packaging (CSP). The principles of the invention are further useful IC packages 701 having wire bond implementations as well as flip chip type implementations. Such chip packages 701 can be applied to numerous applications in electronic devices 702. Examples of particularly attractive electronic device 702 implementations include computers, PDA's, cellular telephones, and other electronic equipment.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Although only a few configurations are expressly disclosed herein, it should be appreciated by anyone having ordinary skill in the art that, using the teachings disclosed herein, many different configurations incorporating discrete non-active electrical components into semiconductor integrated circuit packages can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A semiconductor integrated circuit (IC) package comprising:
   a substrate having a first surface and a second surface located on each side of a core portion with the core portion including a stripline having a signal plane and a pair of reference planes each arranged on different layers of the substrate core, the pair of reference planes including a power plane, and a ground plane each defined by a planar layer of conductive material arranged such that the signal plane is positioned between the pair of reference planes of the stripline, the signal plane having an electrical signal trace extending a first length across the signal plane and arranged in between the pair of reference planes such that one of the reference planes extends contiguously above a substantial portion of the first length of the signal trace and such that another of the reference planes extends contiguously under a substantial portion of the first length of the signal trace enabling the plurality of electrical signal traces to be shielded by the ground plane and the power plane of the stripline;
   an integrated circuit die mounted to a first surface of the substrate; and
   a discrete non-active electrical component mounted on the first surface of the substrate so that the integrated circuit die is electrically connected with the discrete non-active electrical component through the electrical signal trace of the package and wherein the discrete non-active electrical component is also electrically connected with an I/O (input/output) solder ball arranged on the second surface of the substrate said connection facilitated by a conductive via that passes through the core portion of the substrate.

2. The package of claim 1 wherein the discrete non-active electrical component is mounted relatively close to the die and not near an edge of the substrate.

3. The package of claim 1 wherein the discrete non-active electrical component comprises a capacitive element that operates as an AC coupling capacitor.

4. The IC package of claim 1 wherein the substrate is arranges so that said one of the reference planes that extends contiguously above a substantial portion of the first length of the signal trace is configured so that extends contiguously over substantially all of the of the first length of the signal trace and such that the another reference plane extends contiguously under substantially all of the first length of the signal trace.

5. An electronic device incorporating the IC package of claim 4 wherein the electronic device comprises a computer device.

6. A semiconductor integrated circuit (IC) package comprising:
   a substrate having a first surface and a second surface located on opposites sides of a core portion with the core portion including;
   a stripline having,
   a pair of reference planes comprising a power plane and a ground plane;
   the power plane comprising a single layer of planar conductive material arranged to provide power,
   the ground plane comprising a single layer of planar conductive material arranged to provide grounding, and
   a signal layer having a first signal line having a first length arranged between the reference planes such that one of the reference planes extends contiguously above a substantial portion of the first length of the first signal line and such that another of the reference planes extends contiguously under a substantial portion of the first length of the first signal line enabling the first signal line to be shielded by the ground plane and the power plane of the stripline;
   an integrated circuit die mounted to a first surface of the substrate; and
   a discrete non-active electrical component mounted on the first surface of the substrate; and
   a connection path, that defines an electrical conduction path between said die and the discrete non-active electrical component and between the component and an I/O (input/output) solder ball arranged on the second surface of the substrate, said path including a conductive first via that passes through the core portion of the substrate.

7. The IC package of claim 6 wherein the conductive first via passes through an aperture in the planar conductive material of at least one of said ground plane and said power plane.

8. The IC package of claim 7 wherein the first surface of the substrate has formed thereon a pattern of surface mounted conductive traces, portions of said traces form a portion of the connection path wherein a trace defines the electrical conduction path between said die and the discrete non-active electrical component and another trace defines the electrical conduction path between said component and the first via, said first via connecting the another trace with the an I/O solder ball on the second surface of the substrate.

9. The IC package of claim 8 wherein the discrete non-active electrical component is mounted close to said die.

10. An IC package comprising;
    a layered substrate including a top surface and a bottom surface with a core arranged therebetween, the substrate further including,
    an IC mounting portion arranged on the top surface,
    a plurality of solder balls arranged on the bottom surface,
    the core including a plurality of planes including a first plane, a second plane, and a third plane, configured so that,
      first portions of the first and third planes defining a pair of reference planes,
      a first portion of the second plane defining a signal plane,
      the planes arranged so that the first plane is arranged above the second plane and the third plane is arranged below the second plane and such that each of the planes are separated from each other by regions of insulating material of the core,
      the pair of reference planes comprise a ground plane and a power plane, and
    a stripline region having a stripline structure comprising,
      a signal line extending a first length across the signal plane,
      a ground line having a ground line length extending across the ground plane in a same direction as the first length of the signal line and arranged in one of: directly above the signal line or directly below the signal line, and
      a ground line having a ground line length extending across the ground plane in a same direction as the first length of the signal line and arranged in one of: directly above the signal line or directly below the signal line,
      a power line having a power line length extending along the power plane in a same direction as the first length of the signal line and arranged in another of: directly above the signal line or directly below the signal line and arranged opposite of the signal line from the ground line thereby sandwiching the signal line between the power line and the ground line;
    an integrated circuit die mounted to IC mounting portion of the substrate; and
    a discrete non-active electrical component mounted on the top surface of the substrate and electrically connected with the integrated circuit die using the signal line of the stripline and also electrically with one of said solder balls arranged on the bottom surface of the substrate using a conductive via that passes through the core portion of the substrate.

11. The package of claim 10 wherein the conductive via that passes through the core portion of the substrate also passes through an aperture in one of said ground plane and power planes to enable contact with the I/O (input/output) solder ball arranged on the second surface.

12. The package of claim 10, wherein the discrete non-active electrical component is selected from among the group consisting of capacitors, resistors, and inductors.

13. The IC package of claim 10 wherein the package comprises a ball grid array package.

14. The IC package of claim 10 wherein the package comprises a flip chip package.

15. An IC package comprising;
a layered substrate including a top surface and a bottom surface with a core arranged therebetween, the substrate further including,
an IC mounting portion arranged on the top surface,
a plurality of I/O solder balls arranged on the bottom surface,
the core including a plurality of planes including a first plane, a second plane, and a third plane each arranged so that the first plane is lies above the second plane and the third plane lies below the second plane and so that each of the planes are separated from each other by regions of insulating material of the core,
a stripline region and a microstrip region,
the stripline region comprising a stripline structure having,
    first portions of the first, second, and third planes, each configured such that
    the first portion of the second plane defining a first signal plane, and
    the first portions of the first and third planes define a pair of reference planes comprising a first ground plane and a first power plane arranged such that one of the reference planes lies above the signal plane wherein another of the reference planes lies below the signal plane,
    the stripline structure further comprising,
    a first signal line extending a first length across the first signal plane,
    a first ground line having a first ground line length extending across the first ground plane in a same direction as the first signal line, and
    a first power line having a first power line length extending across the first power plane in a same direction as the first signal line;
the microstrip region comprising a microstrip structure having,
    second portions of the first, second, and third planes, each configured such that
    the second portion of the first plane defining a second signal plane, and
    the second portions of the second and third planes define a pair of second reference planes comprising a second ground plane and a second power plane arranged such that both second reference planes lie below the second signal plane,
    the microstrip structure further comprising,
    a second signal line extending a second length across the second signal plane,
    a second ground line having a second ground line length extending across the second ground plane in a same direction as the second signal line, and
    a second power line having a second power line length extending across the second power plane in a same direction as the second signal line;
an integrated circuit die mounted to IC mounting portion of the substrate; and
a discrete non-active electrical component mounted on the top surface of the substrate and electrically connected with the integrated circuit die using the signal line of the microstrip and also electrically with one of said solder balls arranged on the bottom surface of the substrate using a conductive via that passes through the core portion of the substrate.

16. A semiconductor integrated circuit (IC) package as recited in claim 15 wherein:
the substrate is arranged with the microstrip region located spatially closer to the integrated circuit die mounted on the substrate relative to a more distantly positioned strip line region wherein the close proximity the microstrip region to the integrated circuit die enables the electrical traces of the microstrip to form short conductive paths between the die and the discrete electronic component and wherein longer conduction paths from the discrete component to the I/O solder ball are formed using the shielded electrical traces of the stripline.

* * * * *